United States Patent
Agarwal et al.

(10) Patent No.: US 10,808,729 B2
(45) Date of Patent: Oct. 20, 2020

(54) APPARATUS AND METHOD FOR OPERATING AN OSCILLATION BLADE DEVICE AND A SYSTEM COMPRISING THE APPARATUS

(71) Applicant: Alcatel Lucent, Nozay (FR)

(72) Inventors: Akshat Agarwal, Nozay (FR); Nicholas Jeffers, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 222 days.

(21) Appl. No.: 15/770,361

(22) PCT Filed: Nov. 16, 2016

(86) PCT No.: PCT/EP2016/077808
§ 371 (c)(1),
(2) Date: Apr. 23, 2018

(87) PCT Pub. No.: WO2017/085095
PCT Pub. Date: May 26, 2017

(65) Prior Publication Data
US 2018/0313368 A1    Nov. 1, 2018

(30) Foreign Application Priority Data

Nov. 18, 2015 (EP) .................... 15306834

(51) Int. Cl.
*F04D 33/00* (2006.01)
*H01L 41/04* (2006.01)

(52) U.S. Cl.
CPC ............ *F04D 33/00* (2013.01); *H01L 41/042* (2013.01); *F05D 2260/16* (2013.01); *F05D 2260/407* (2013.01)

(58) Field of Classification Search
CPC ............ F05D 2260/16; F05D 2260/407; F04D 33/00; H01L 41/042; H01L 41/053; H01L 41/094
See application file for complete search history.

(56) References Cited

U.S. PATENT DOCUMENTS

| 4,780,062 A | * | 10/1988 | Yamada | F04D 33/00 310/316.01 |
| 5,436,622 A | * | 7/1995 | Gutman | G08B 6/00 340/407.1 |

(Continued)

FOREIGN PATENT DOCUMENTS

EP    2818730 A1    12/2014

OTHER PUBLICATIONS

International Search Report PCT/ISA/210 for International Application No. PCT/EP2016/077808 dated Mar. 24, 2017.

(Continued)

*Primary Examiner* — Dominick L Plakkoottam
(74) *Attorney, Agent, or Firm* — Harness, Dickey & Pierce, P.L.C.

(57) ABSTRACT

A power source is configured to apply a first alternating electric excitation signal to an oscillation blade device at a first excitation frequency causing a blade of the oscillation blade device to oscillate at a first oscillation frequency. A current detector is configured to measure amplitude values of the current supplied by the power source to the oscillation blade device. A processor is configured to assess a plurality of successive peak values of the measured amplitudes, determine a second oscillation frequency for the blade if variation in the successive peak values is detected and send a command to the power source to apply a second alternating (Continued)

electric excitation signal to the oscillation blade device at a second excitation frequency which matches the determined second oscillation frequency.

13 Claims, 3 Drawing Sheets

(56) References Cited

U.S. PATENT DOCUMENTS

| | | | | |
|---|---|---|---|---|
| 2005/0001091 A1* | 1/2005 | Raney | ............... | B64C 33/02 |
| | | | | 244/11 |
| 2009/0026881 A1* | 1/2009 | Erturk | ............... | F04D 33/00 |
| | | | | 310/311 |
| 2010/0038994 A1 | 2/2010 | Eichhorner et al. | | |
| 2010/0047092 A1* | 2/2010 | Erturk | ............... | F04D 33/00 |
| | | | | 417/410.2 |
| 2016/0027989 A1* | 1/2016 | Ludlow | ............ | H01L 41/042 |
| | | | | 310/317 |

OTHER PUBLICATIONS

Written Opinion of the International Searching Authority PCT/ISA/237 for International Application No. PCT/EP2016/077808 dated Mar. 24, 2017.

\* cited by examiner

APPARATUS AND METHOD FOR OPERATING AN OSCILLATION BLADE DEVICE AND A SYSTEM COMPRISING THE APPARATUS

CROSS-REFERENCE TO RELATED APPLICATIONS

This application is a national phase under 35 U.S.C. § 371 of PCT International Application No. PCT/EP2016/077808 which has an International filing date of Nov. 16, 2016, which claims priority to European Application No. 15306834.1, filed Nov. 18, 2015, the entire contents of each of which are hereby incorporated by reference.

The present disclosure relates techniques for operating an oscillation blade device.

BACKGROUND

Oscillation blade devices are known. One typical example of an oscillation blade device is a cantilever fan, typically used in electric or electronic equipment where components in the equipment heat up during operation and need to be cooled off. Another example of oscillation blade devices is a flexible wing structure typically used in micro-aerial vehicles, sometimes referred to as drones. Oscillation blade devices are typically considered to be particularly useful where space, or weight is an issue due to small size and compactness of the equipment. In the case of cantilever fans, the oscillation of the blade, or cantilever, causes the surrounding air to move, thereby generating airflow which is used for cooling the component. In the case of flexible wing structures, the oscillation of the blade acts as a flapping wing which causes the surrounding air to move, thereby propelling the body to which the wing structure is attached, e.g. a drone.

In some examples an oscillation blade devices may use a piezoelectric element to oscillate a planar body, whereas in some other examples it may use an electromagnetic element to oscillate a planar body. Other examples may also exist. The planar body is what is sometimes referred to as blade or cantilever.

Oscillation blade devices typically use an alternating driving force from a driver to cause the blade to oscillate. This driving force may be obtained by activating a driver element, for example the piezoelectric element or the electromagnetic element in the examples above.

SUMMARY

Some embodiments feature an apparatus comprising:
a power source configured to generate an alternating electric excitation signal;
a current detector configured to measure amplitude values of a current supplied by the power source; and
a processor;
wherein the apparatus is configured to:
apply, by the power source, a first alternating electric excitation signal to an oscillation blade device at a first excitation frequency causing a blade of the oscillation blade device to oscillate at a first oscillation frequency;
measure, by the current detector, amplitude values of the current supplied by the power source to the oscillation blade device said current representing a frequency which is a combination of the first excitation frequency and the first oscillation frequency of the blade;
assess, by the processor, a plurality of successive peak values of said measured amplitudes;
determine, by the processor, a second oscillation frequency for the blade if variation in the successive peak values is detected; and
apply, by the power source, a second alternating electric excitation signal to the oscillation blade device at a second excitation frequency which is equal to the determined second oscillation frequency.

According to some specific embodiments, the power source is configured to provide to the processor, through a connection path, information related to a frequency of the alternating electric excitation signal.

According to some specific embodiments, the first excitation frequency matches a nominal resonant frequency of the blade.

According to some specific embodiments, the detected variation in the successive peak values is indicative of presence of a beating phenomenon in the oscillation of the blade.

According to some specific embodiments, if the successive peak values are substantially equal to each other the processor determines that the apparatus is operating under optimal conditions; otherwise the processor determines that the apparatus is not operating under optimal conditions.

According to some specific embodiments, the measurements by the current detector are repeated until sufficient peak values are obtained to enable the processor to determine at least one complete cycle of a periodic wave representing the current measured by the current detector.

According to some specific embodiments, the processor is further configured to determine the actual resonant frequency of the blade during a non-optimal operation, said actual resonant frequency being different from the blade's nominal resonant frequency.

According to some specific embodiments, the processor is configured to send a command to the power source to vary the frequency of the alternating electric excitation signal applied to the oscillation blade device so that such new excitation frequency matches the determined actual resonant frequency of the blade.

According to some specific embodiments, the power source is also configured to provide to the processor, information related to the frequency of the alternating electric excitation signal.

Some embodiments feature a system comprising the apparatus as disclosed herein, further comprising:
an oscillation blade device having a driver electrically coupled to the power source and configured to generate a driving force in response to receiving an alternating electric excitation signal from the power source, and a planar body attached to the driver and configured to oscillate in response to the driving force generated by the driver.

Some embodiments feature a cooling assembly comprising the system as disclosed herein.

Some embodiments feature a micro-aerial vehicle comprising the system as disclosed herein.

Some embodiments feature a method for operating an apparatus, the method comprising:
applying, by a power source, a first alternating electric excitation signal to an oscillation blade device at a first excitation frequency causing a blade of the oscillation blade device to oscillate at a first oscillation frequency;
measuring, by a current detector, amplitude values of the current supplied by the power source to the oscillation blade device said current representing a frequency which is a combination of the first excitation frequency and the first oscillation frequency of the blade;

assessing, by a processor, a plurality of successive peak values of said measured amplitudes;

determining, by the processor, a second oscillation frequency for the blade if variation in the successive peak values is detected; and applying, by the power source, a second alternating electric excitation signal to the oscillation blade device at a second excitation frequency which matches the determined second oscillation frequency.

These and further features and advantages of the present invention are described in more detail, for the purpose of illustration and not limitation, in the following description as well as in the claims with the aid of the accompanying drawings.

DETAILED DESCRIPTION OF EXEMPLARY EMBODIMENTS

Figure 1:
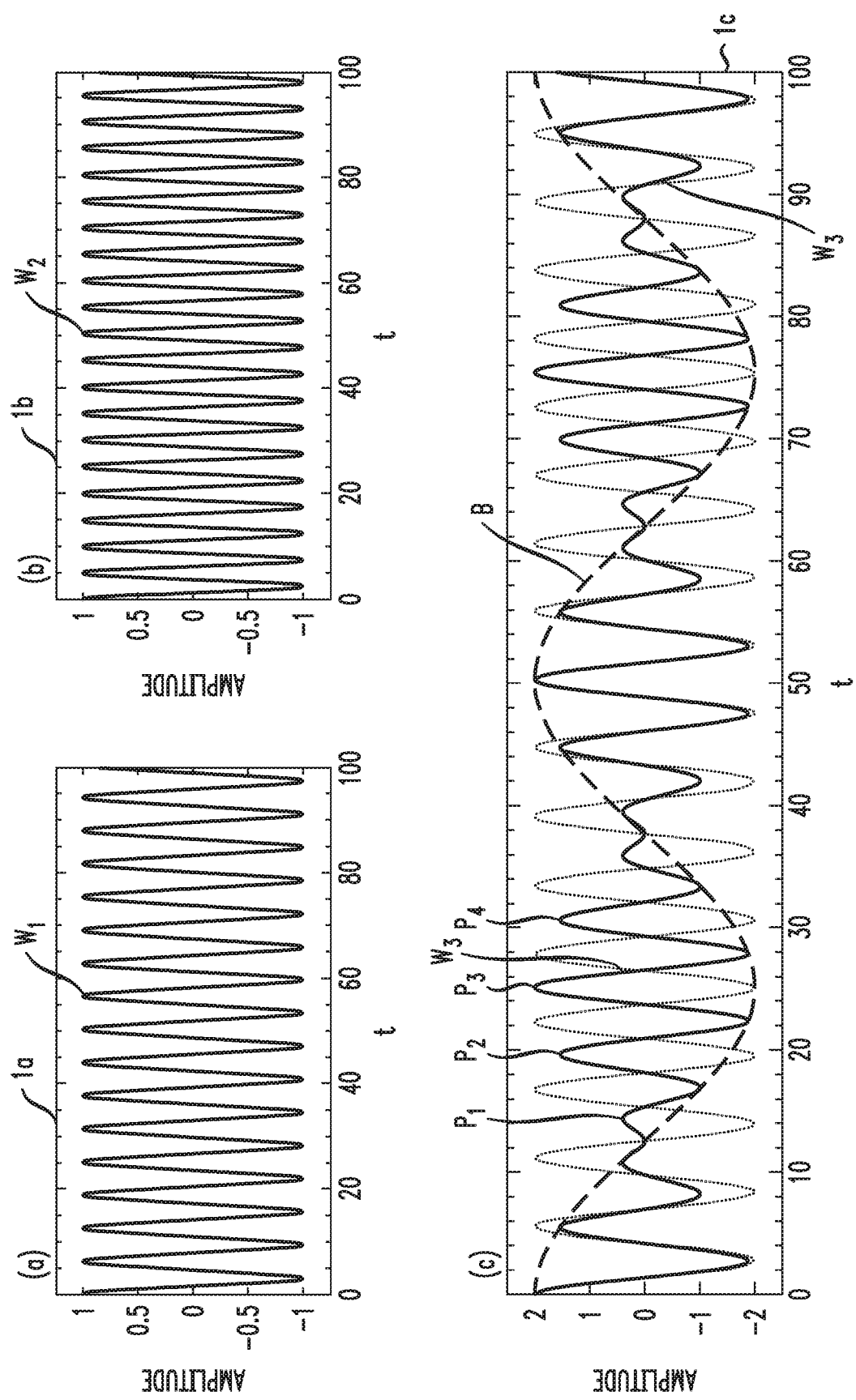
FIG. 1 is an exemplary representation of a beating phenomenon between two waves.

In the following reference is often made to piezoelectric fans. However the disclosure is not so limited and the solution proposed herein is likewise applicable to other known types of oscillation blade devices such as fans using electromagnetic elements to oscillate a planar body, or devices such as flexible wing structures useable for example in micro-aerial vehicles.

The term planar as used herein with reference to planar body is to be understood to refer to a generally flat three-dimensional structure, wherein one dimension of the structure is substantially smaller (e.g. one or more orders of magnitude smaller) than the other two dimensions of the structure.

Typically a piezoelectric fan, herein also referred to as piezofan, uses a piezoelectric element to drive a planar body. The piezoelectric element comprises a body of a solid material having the property of generating an electric signal (by accumulating electric charge) when a mechanical stress such as a pressure is applied thereupon. Conversely, such piezoelectric element exhibits a mechanical movement in response to an electric excitation signal (current or voltage) applied thereto. Some examples of materials exhibiting piezoelectric property are certain crystals or ceramics.

The piezoelectric element is physically attached, e.g. bonded, to an end of a planar body (blade). The other end of the planar body is free and movable. When an alternating electric voltage (or current) is applied to the piezoelectric element, the latter exhibits an oscillating movement, causing the planar body, or blade, to oscillate at a frequency which is preferably matching the drive frequency of the alternating electric signal. If the frequency of the alternating voltage (or current) is equal to the resonant frequency of the blade, the latter produces an oscillating movement at the free end thereof at said resonant frequency. The oscillation of the free end of the blade produces an air flow in a similar manner as a conventional hand fan.

It is desirable to cause these fans to operate at the resonant frequency of the blade because oscillation at such resonant frequency typically provides the largest displacement amplitude of the free end (tip) of the blade, which results in the generation of the maximum volume of airflow by the blade.

The oscillation amplitude of the blade is extremely sensitive to a number of parameters including operating frequency, the mass and rigidity of the blade. Over the lifetime of oscillation blade devices fouling may occur on the exterior of the blade due to dust, dirt, blocking objects and the like. Adherence of dust and dirt to the body of the blade can cause a change in the mass of the blade. As a result of such change in the mass of the blade the resonant frequency of the blade may change and therefore the deflection amplitude of the blade during oscillation may be drastically reduced. Similarly, a change or degradation in the mechanical properties of the blade over the lifetime can also alter the blade resonant frequency. For example, if the rigidity of the blade changes (i.e. due to degradation of the blade material or degradation of the bonding materials), this also alters the resonant frequency.

The reduction in the deflection of the tip considerably reduces the device's air moving capabilities. For example, an oscillation blade fan hampered with this problem would likely fail to provide an efficient cooling performance. As a result of such inefficient cooling performance, the components to be cooled may overheat and therefore component failures may occur. To ensure maximum air flow from the device, it is therefore important to maintain operation at the resonant frequency of the blade.

As it is known, at the resonant frequency, the blade has the largest displacement from its position at rest (i.e. highest oscillation amplitude). Currently, these systems are typically tuned at the manufacturing facility by observing the maximum displacement during oscillation with varying input voltage frequency. The frequency at which displacement is highest is determined and is the recommended operating frequency, which herein is also referred to as "nominal" resonant frequency.

However, the resonant frequency of the blade is dependent on properties of the oscillating component as well as those of the surroundings (e.g. air). Since these devices are deployed in a variety of locations, different ambient conditions and local materials used to manufacture the devices can result in resonant frequencies which are unique for each device. Furthermore, these components are typically not housed in climate-controlled clean environments and thus may experience temporal changes in the resonant frequency due to such environmental issues. Changes in material properties due to temperature swings and variations in its weight caused by adhesion of dust particles, as mentioned above, can also change the resonant frequency.

To re-tune the systems when it is deployed, this process has to be carried out again either on-site or at the manufacturing facility and typically requires partial disassembling of the system. The time and effort required for this process typically discourages periodic tuning of the blades, implying that the blades may not always operate at the resonant frequency which in turn reduces the system's ability to move air.

It is therefore desired to provide a solution for dynamically determining the resonant frequency of a blade in an oscillation blade device which may have deviated from its nominal resonant frequency value. It is further desired to dynamically apply to the oscillation blade device an alternating electric excitation signal which has a frequency substantially equal to the determined resonant frequency of the blade.

The solution proposed herein would therefore reduce operating costs while maintaining optimal performance of the device as it would allow for automatically maintaining the oscillation blade device operating at its actual (real time) resonant frequency (which may be different from the nominal resonant frequency) without the need to turn the device off.

The proposed solution takes advantage of the known beating phenomenon which occurs when two waves of different frequencies interact (or combine). In case of oscillation blade devices, when the frequency of the input alternating electric signal is different from the resonant frequency of the blade, the beating phenomenon can be seen in the displacement of the blade as well as in the current measured across the oscillation blade device. Although the beating phenomenon is well known, a non-limiting brief description is provided below with reference to FIG. 1, to help better understand the present disclosure. In FIG. 1 the abscissa (x-axis) represents time (t) and the ordinate (y-axis) represents the amplitude of the waveforms.

Two sinusoidal waves W1 and W2 of different frequencies are considered as shown by FIGS. 1a and 1b. For simplicity it is assumed that both waveforms W1 and W2 have the same amplitude a. A combination (which also can be referred to as addition or interaction) of these two waves produces a new waveform W3 as shown in FIG. 1c. As can be seen, waveform W3 shows peaks, for example at P1, P2, P3 and P4 (among others) which have different amplitude values. The variation of the amplitude values is repeated in cycles, each cycle representing a complete period of waveform. The variation in the peak values, e.g. P1, P2, P3 and P4 represents the beating phenomenon which is shown in FIG. 1c by a dashed line B. It is to be noted that that the maxima and minima of the wave W3 oscillate at twice the frequency of the beat wave B. This phenomenon has been employed in the implementation of the present solution.

It is assumed that the waveform W1 in FIG. 1a represents the frequency of the current (or voltage) input into the oscillation blade device and waveform W2 in FIG. 1b represents the resonant frequency of the blade, which is different from the frequency of the wave W1. Therefore the waveform W3 would represent the beating phenomenon when the blade is being driven at a frequency which does not match its resonant frequency.

Since the input frequency is known (and can be controlled), the resonant frequency is easily calculated from the waveform which shows the beating phenomenon. This waveform can be obtained by tracking the displacement of the beam or assessing possible variations in the amplitude of the current across the oscillation blade device. The latter technique is used in the solution proposed herein.

Let waveform W1 be represented by the following:

$$y_1 = a\cos(f_1 t) \quad (1)$$

where $y_1$ represents the amplitude as a function of time, a is the maximum amplitude, $f_1$ represents the frequency of the waveform W1 and t represent time. Likewise, let waveform W2 be represented by the following:

$$y_2 = a\cos(f_2 t) \quad (2)$$

where $y_2$ represents the amplitude as a function of time, a is the maximum amplitude, $f_2$ represents the frequency of the waveform W1 and t represent time. The combined waveform W3 can therefore be represented by the following:

$$y_3 = a\cos(f_1 t) + a\cos(f_2 t) = 2a\cos\left(\frac{|f_1 - f_2|}{2}t\right)\cos\left(\frac{|f_1 + f_2|}{2}t\right) \quad (3)$$

where $y_3$ represents the amplitude of the waveform W3.

In the above equation (3), $y_3$ may be measured at time t, $f_1$ is known as the frequency of the electric excitation signal applied to the device. Therefore $f_2$, i.e. the resonant frequency of the blade may be easily obtained.

It is further to be noted that the beat waveform B may be represented by the following:

$$y_B = a\cos\left(\frac{|f_1 - f_2|}{2}t\right) \quad (4)$$

Thus alternatively, if values of $Y_B$ is measured at a given time t and $f_1$ is known, then $f_2$ may be calculated from equation (4).

Figure 2:
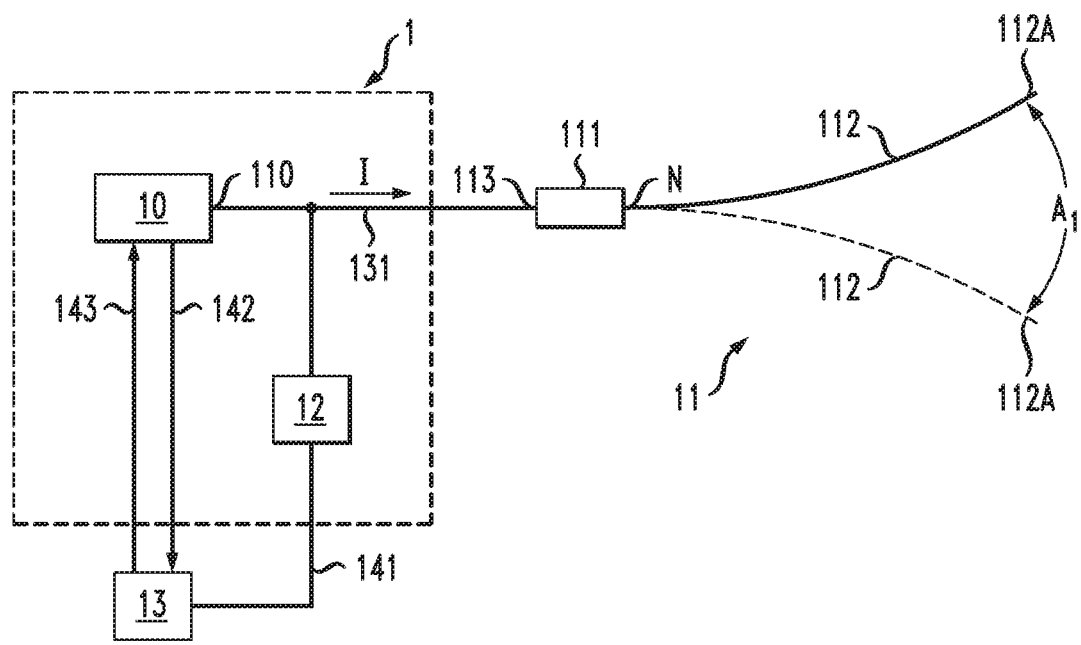
FIG. 2 is an exemplary schematic representation of an assembly comprising an apparatus according to some embodiments.

FIG. 2 is an exemplary schematic representation of an apparatus 1 including a power source 10, an oscillation blade fan 11 and a current detector 12. Oscillation blade fan 11 comprises a driver 111 and a planar body (blade) 112. The driver is, in this example, a piezoelectric element. The power source 10 may be configured to generate an alternating electric excitation signal (voltage or current) at a port 110 thereof. The port 110 is electrically connected to a corresponding port 113 of the piezofan 11 by electric connection path 131. The current detector 12 is configured to detect the waveform of the current supplied by the power source to the oscillation blade device and provide such information to a processor 13 as will be described in further detail below.

The power source 10 is also configured to provide, through a connection path 142, to the processor 13, information related to the frequency of the alternating electric excitation signal. This information is provided to the processor 13 in a suitable manner and in the form of data useable by the processor 13, as known in the art, so as to enable the processor 13 to analyze the data received and provide commands based on such analysis, as will be described further below with reference to FIG. 3.

The current detector 12 may be a device which is independent from the power source 10 as represented in the figure and coupled at any convenient point to the electric connection path 131 or it may be integrated inside the power source (not shown in the figure).

In a first stage of operation, the power source 10 may generate an alternating electric excitation signal which is output from port 110 and is input into the piezoelectric element 111 through port 113. The electric signal causes the piezoelectric element to undergo mechanical stress in the form of movements which are transferred to the blade 112 attached to the piezoelectric element 111. As a consequence, the blade 112 is caused to oscillate at the free end 112a thereof, thereby generating a flow of air in the vicinity of the free end 112a.

Under optimal conditions, the blade 112 is set to oscillate at its nominal resonant frequency and the frequency of the alternating electric signal generated by the power source 10 is set to be equal to the nominal resonant frequency of the blade. Therefore, if the frequency of the alternating electric excitation signal matches the nominal resonant frequency of the blade 112, the blade should reach its maximum deflection for the applied alternating electric excitation signal.

In the embodiment of FIG. 1, the blade 112 is shown in two positions, one position is shown by a solid line and the other position is shown by a broken line. It is assumed that the two positions of the blade show respective maximum deflections of the tip of the blade as the blade oscillates from one position to the other. This maximum deflection is schematically shown in the figure by double-headed arrow $A_1$.

If due to any reason, examples of which were given above, the resonant frequency of the blade deviates from its nominal resonant frequency, then the blade will no longer be oscillating at its maximum deflection. In such a case, maximum deflection may still be achieved when the frequency of the alternating electric signal matches the actual (deviated from nominal) resonant frequency of the blade 112. However, as the power source is still applying the electric excitation signal at a frequency which matches the nominal resonant frequency of the blade, a beating phenomenon will be created.

Figure 3:
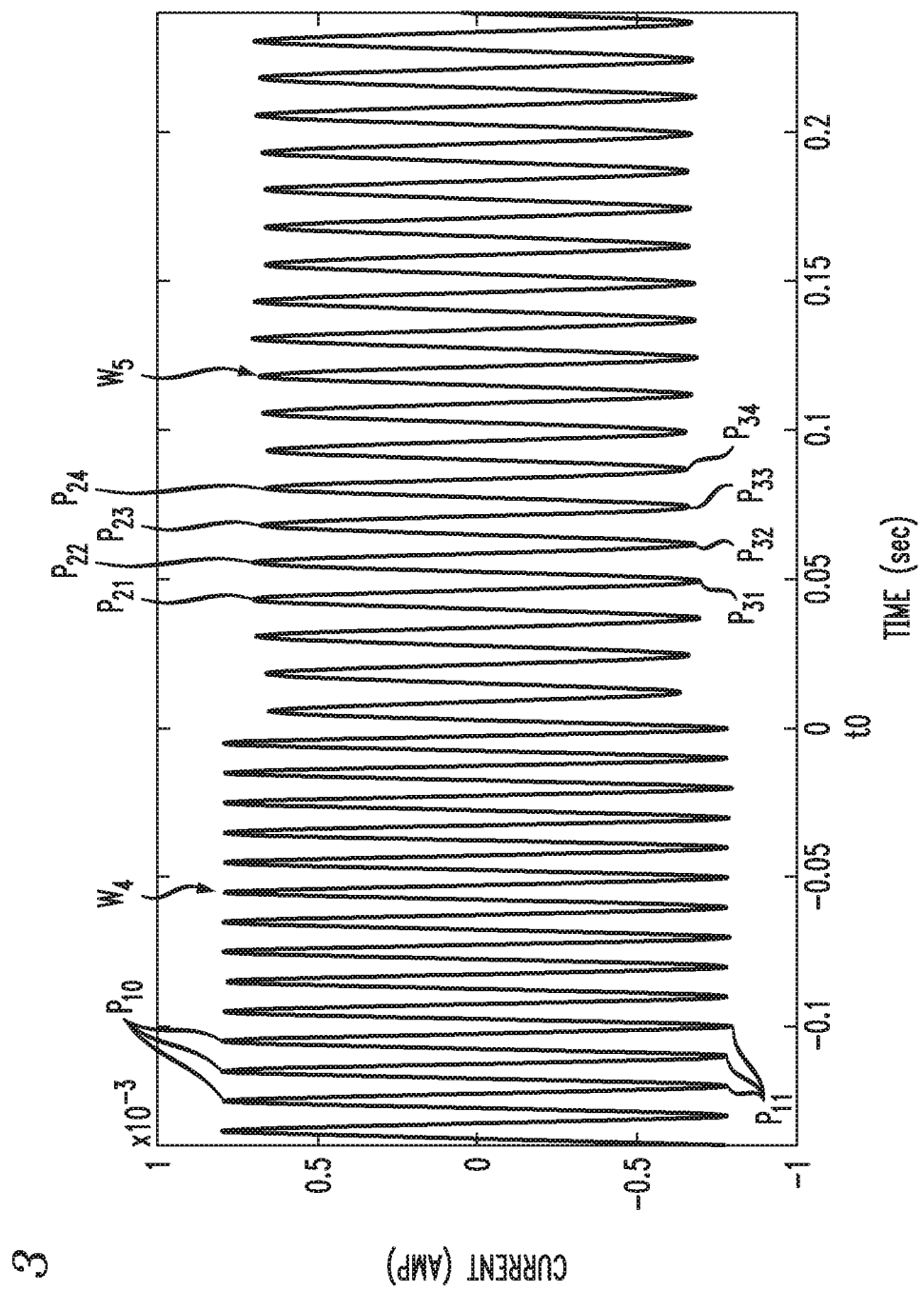
FIG. 3 is an exemplary representation of a current waveform supplied to an oscillation blade device before and after a change in an excitation frequency applied to the oscillation blade device.

FIG. 3 shows a graph representing a waveform which is generated as a combination of the resonant frequency of the blade and the frequency of the excitation signal applied to the oscillation blade device as shown in FIG. 2. In this figure, the abscissa (x-axis) represents time (t) and the ordinate (y-axis) represents the amplitude of current applied to the oscillation blade device. This figure further shows two phases of operation, one being a first phase before time to in which the frequency of the alternating electric excitation signal applied to the oscillation blade device matches the resonant frequency of the blade and thus the apparatus is working under optimal conditions; and a second phase being after time to in which the frequency of the alternating electric excitation signal applied to the oscillation blade device does not match the resonant frequency of the blade and thus the apparatus is not working under optimal conditions.

As can be seen in the figure, the waveform W4 corresponding to the first phase shows upper and lower envelopes being substantially flat, i.e. the peak values P10 of the waveform at maxima points of the curve are substantially equal (same arguments may apply to peak values P11 at minima points); whereas the waveform W5 corresponding to the second phase shows an upper envelope having a periodic type waveform, i.e. the peak values P21, P22, P23, P24 and beyond of the waveform at maxima points of the curve vary periodically (same arguments may apply to peak values P31, P32, P33, P34 and beyond of the waveform at minima points).

Referring simultaneously to FIGS. 2 and 3, the current detector 12 is configured to measure the amplitude of the current I being supplied by the power source 10 to the driver 111. The measured amplitude values include peak values such as P10 or P11 or P21-P24 or P31-P34.

Therefore, in the first phase described above, the current detector 12 may measure a plurality of peak values P10 (or P11) which would represent substantially equal values.

It is to be noted that in real devices a even when operating at resonance, a small deviation in peak values may still be present which may be considered negligible and the system's operation would be considered as optimal. For this reason the term "substantially" has been used in the previous passage to show such small and negligible variations.

These measured values, including the peak values, may then be provided, through a connection path 141 to a processor 13 in a suitable manner and in the form of data useable by the processor 13, as known in the art.

The processor 13 is configured to assess the plurality of the measured amplitude values including successive peak values P10 (or P11). As the successive peak values are substantially equal to each other the processor 13 may determine that the apparatus is operating under optimal conditions. At this point the processor may determine that no change in the operation parameters of the system is necessary and the system may therefore be allowed to operate as it was prior to the measurements until a new cycle of measurement is started.

In the second phase described above (i.e. device not operating under optimal conditions), the current detector 12 still measures the amplitude of the current I being supplied by the power source 10 to the driver 111. In this second phase however, the measured amplitude values correspond to the waveform W5 and thus include unequal peak values such as P21-P24 or P31-P34.

Here again similar to the previous phase, the measured values, including the peak values, may be provided to the processor 13.

Preferably, the measurements by the current detector 12 may be repeated until sufficient peak values are obtained to enable the processor to determine at least one complete cycle of the periodic wave W5. This operation has the advantage of reducing error in determining the resonance frequency.

The processor 13 then assesses the plurality of the measured amplitude values including the successive peak values P21 to P 24 and beyond (or P31 to P34 and beyond). As the successive peak values vary with respect to each other the processor 13 may determine that the apparatus is not operating under optimal condition.

Furthermore, as the waveform W5 is a combination of two periodic waveforms (i.e. the frequency of the alternating electric excitation signal and the resonant frequency of the blade) the peak values will show a periodic variation.

The processor may be configured to take further steps in order to remedy the problem of operation of the device under non-optimal conditions.

For example, as the processor 13 determines that the apparatus is not operating under optimal conditions it may determine the actual resonant frequency of the blade during this non-optimal operation. This actual resonant frequency may be different from the blade's nominal resonant frequency. In order determine the actual resonant frequency of the blade 112, the processor may use equation (3) which is repeated below.

$$y_3 = a\cos(f_1 t) + a\cos(f_2 t) = 2a\cos\left(\frac{|f_1 - f_2|}{2} t\right)\cos\left(\frac{|f_1 + f_2|}{2} t\right) \quad (3)$$

As the processor 13 has received values for the amplitude of the waveform W5 at time t from the current detector 12, it can use one of these values in equation (3) as $y_3$ at time t.

Also $f_1$ is known to the processor as the being the frequency of the alternating electric excitation signal applied to the device (for example this frequency may be registered in the processor).

Therefore $f_2$, i.e. the actual resonant frequency of the blade may be easily obtained during the non-optimal operation.

As mentioned above, equation (4), repeated below, provides an alternative way of determining the frequency $f_2$ which in this case would be the actual resonant frequency of the blade.

$$y_B = a\cos\left(\frac{|f_1 - f_2|}{2}t\right) \quad (4)$$

Thus values for $Y_B$ pertaining to waveform B (FIG. 1) may be determined by the processor based on the current amplitude measurements provided by the current detector 12. Furthermore, the values for a and $f_1$ are known, then $f_2$ may be calculated from equation (4).

Once the actual resonant frequency of the blade 112 is determined, the processor 13 may configured to send a command to the power source 10 to vary the frequency of the alternating electric excitation signal applied to the oscillation blade 112 device so that such new excitation frequency is equal to the determined actual resonant frequency of the blade 112.

The power source is also configured to provide, through a connection path 142, to the processor 13, information related to the frequency of the alternating electric excitation signal. This information is provided to the processor 13 in a suitable manner and in the form of data useable by the processor 13, as known in the art, so as to enable the processor 13 to analyze the data received and provide commands based on such analysis.

The above apparatus may also be used to determine the resonant frequency of the blade even if the oscillation blade device 11 is working under optimal conditions. It is understood that when the optimal conditions exist, the oscillation frequency of the blade 112 and the frequency of the electric excitation current applied to the device should match. Thus the latter frequency, which is known, is indicative of the resonant frequency of the blade. However, if for any reason, the resonant frequency of the blade is not known, the processor 13 may be programmed to send a command to the power source 10 to change the frequency of the alternating electric excitation signal applied to the device 11 and command the current detector 12 to perform the measurements of the current amplitudes and provide the results to the processor 13 for a new assessment of the resonant frequency as described in detail with reference to FIGS. 2 and 3. This usage of the apparatus may be useful in cases where a system reset due to a power failure results in a loss of data regarding the resonance frequency. In such cases, the resonance frequency can be determined using the above process.

The processor may be of any known type of programmable device comprising hardware such as an ASIC, or a combination of hardware and software means, e.g. an ASIC and an FPGA, or at least one microprocessor and at least one memory with software modules located therein.

In this manner, the performance of the oscillation blade fan may be maintained, or if needed corrected, in a dynamic fashion without the need to stop the operation of the fan.

As mentioned above, the proposed solution is not limited only to oscillation blade fans and is also applicable to other structures using an oscillation blade device such as flexible wing structures. For example in the case of flexible wing structures, the oscillation blade device is typically used for enabling a micro-aerial vehicle to fly and not for cooling an electronic component. However, it is also of utmost importance that the oscillating blade device in micro-aerial vehicles also operates at its resonant frequency to maintain an optimum performance for the device which would otherwise degrade the flying capabilities of the micro-aerial vehicle. Therefore, similar solutions as those described with reference to the embodiments related to an oscillation blade fan, are also applicable, mutatis mutandis, to the oscillation blade device used as a flexible wing structure.

The proposed solution offers various advantages as it allows for dynamically detecting non-optimal operation of the oscillation blade device and take measure to recover optimal operation conditions during operation.

The various embodiments of the present disclosure may be combined as long as such combination is compatible and/or complimentary.

Further it is to be noted that the list of structures corresponding to the claimed means is not exhaustive and that one skilled in the art understands that equivalent structures can be substituted for the recited structure without departing from the scope of the disclosure.

It should be appreciated by those skilled in the art that any block diagrams herein represent conceptual views of illustrative circuitry embodying the principles of the disclosure.

It is also to be noted that the order of the steps of the method of the disclosure as described and recited in the corresponding claims is not limited to the order as presented and described and may vary without departing from the scope of the invention.

The invention claimed is:

1. An apparatus comprising:
   a power source configured to generate an alternating electric excitation signal;
   a current detector configured to measure amplitude values of a current supplied by the power source; and
   a processor configured to cause the apparatus to,
   apply, by the power source, a first alternating electric excitation signal to an oscillation blade device at a first excitation frequency causing a blade of the oscillation blade device to oscillate at a first oscillation frequency,
   measure, by the current detector, amplitude values of the current supplied by the power source to the oscillation blade device, said current representing a frequency which is a combination of the first excitation frequency and the first oscillation frequency of the blade, the combination resulting from a beating phenomenon in the oscillation of the blade,
   assess a plurality of successive peak values of said measured amplitudes,
   determine a second oscillation frequency for the blade if variation in the successive peak values is detected, and
   apply, by the power source, a second alternating electric excitation signal to the oscillation blade device at a second excitation frequency which is equal to the determined second oscillation frequency.

2. The apparatus of claim 1, wherein the power source is configured to provide to the processor, through a connection path, information related to a frequency of the alternating electric excitation signal.

3. The apparatus of claim 1, wherein the first excitation frequency matches a nominal resonant frequency of the blade.

4. The apparatus of claim 1, wherein the processor is further configured to cause the apparatus to:
   determine a presence of the beating phenomenon in the oscillation of the blade based on the detected variation in the successive peak values.

5. The apparatus of claim 1, wherein the processor is further configured to:

determine that the first excitation frequency does not need to be changed if the successive peak values are substantially equal to each other.

6. The apparatus of claim 1, wherein the measurements by the current detector are repeated until sufficient peak values are obtained to enable the processor to determine at least one complete cycle of a periodic wave representing the current measured by the current detector.

7. The apparatus of claim 5, wherein the processor is further configured to cause the apparatus to:
determine an actual resonant frequency of the blade, said actual resonant frequency being different from the blade's nominal resonant frequency.

8. The apparatus of claim 7, wherein the processor is further configured cause the apparatus to:
send a command to the power source to vary the frequency of the alternating electric excitation signal applied to the oscillation blade device so that such new excitation frequency matches the determined actual resonant frequency of the blade.

9. A system comprising the apparatus of claim 1, further comprising:
an oscillation blade device having a driver electrically coupled to the power source and configured to generate a driving force in response to receiving an alternating electric excitation signal from the power source, and a planar body attached to the driver and configured to oscillate in response to the driving force generated by the driver.

10. A cooling assembly comprising the system of claim 9.

11. A micro-aerial vehicle comprising the system of claim 9.

12. A method for operating an apparatus, the method comprising:
applying, by a power source, a first alternating electric excitation signal to an oscillation blade device at a first excitation frequency causing a blade of the oscillation blade device to oscillate at a first oscillation frequency;
measuring, by a current detector, amplitude values of the current supplied by the power source to the oscillation blade device, said current representing a frequency which is a combination of the first excitation frequency and the first oscillation frequency of the blade, the combination resulting from a beating phenomenon in the oscillation of the blade,
assessing, by a processor, a plurality of successive peak values of said measured amplitudes;
determining, by the processor, a second oscillation frequency for the blade if variation in the successive peak values is detected; and
applying, by the power source, a second alternating electric excitation signal to the oscillation blade device at a second excitation frequency which matches the determined second oscillation frequency.

13. The apparatus of claim 1, wherein the processor is further configured to cause the apparatus to:
determine the oscillation frequency of the blade based on the frequency of the current and the first excitation frequency.

* * * * *